United States Patent [19]

Tavis

[11] 3,763,444

[45] Oct. 2, 1973

[54] AMPLITUDE STABILIZED OSCILLATOR CIRCUIT

[75] Inventor: John R. Tavis, Mariposa, Calif.

[73] Assignee: Tavis Corporation, Mariposa, Calif.

[22] Filed: Oct. 1, 1971

[21] Appl. No.: 185,900

Related U.S. Application Data

[63] Continuation of Ser. No. 3,308, Jan. 16, 1970, abandoned.

[52] U.S. Cl. .................. 331/109, 331/114, 331/117

[51] Int. Cl. .............................................. H03b 3/02

[58] Field of Search ........................... 321/2, 16, 18; 331/117, 113, 109, 183, 114

[56] References Cited

UNITED STATES PATENTS

| | | | |
|---|---|---|---|
| 3,061,797 | 10/1962 | Grenier | 331/168 |
| 3,084,294 | 4/1963 | Vallese | 321/18 |
| 3,179,900 | 4/1965 | Garland et al. | 331/109 |
| 3,200,348 | 8/1965 | Kammiller et al. | 331/109 |
| 3,327,199 | 6/1967 | Gardner et al. | 321/2 |
| 3,533,010 | 10/1970 | Bowles | 331/75 |

*Primary Examiner*—John Kominski
*Attorney*—Christie, Parker & Hale

[57] ABSTRACT

An amplitude stabilized oscillator circuit comprising an oscillator having first and second inputs, an output, a positive feedback path between the output and the first input, and a negative feedback path between the output and second input. The amplitude of an AC signal at the oscillator output is maintained constant by controlling the current supplied to the oscillator's second input through the negative feedback path. The negative feedback path effectively includes an AC to DC converter coupled to the oscillator output for supplying a DC signal derived from the oscillator AC output signal to a first input of a differential amplifier. A second input of the differential amplifier is adapted to receive a constant DC reference signal from a Zener diode. The output of the differential amplifier is coupled to the second input of the oscillator for controlling the DC current supplied thereto and thus the amplitude of the AC output signal. As the amplitude of the AC output signal tends to change, the DC current supplied to the oscillator's second input is inversely proportionally changed thereby stabilizing the AC output amplitude.

5 Claims, 2 Drawing Figures

Patented Oct. 2, 1973 3,763,444

INVENTOR
JOHN R. TAVIS

BY
Christie, Parker, & Hale
ATTORNEYS

AMPLITUDE STABILIZED OSCILLATOR CIRCUIT

This is a continuation, of application Ser. No. 3,308 filed Jan. 16, 1970 and now abandoned.

BACKGROUND OF THE INVENTION

1. Field of the Invention

This invention pertains to oscillators and, more specifically, to an oscillator circuit for maintaining constant the amplitude of the oscillator output signal.

2. Description of the Prior Art

Certain electrical devices, such as variable reluctance transducers, require a highly efficient oscillator capable of producing a constant-amplitude output signal notwithstanding variations in temperature, input voltage changes, and parameter changes of any transistor elements employed. Generally, saturable-reactor square-wave oscillators are used for such constant output amplitude purposes because of their stability and efficiency. It was found, however, that sine wave excitation of transducers has a more advantageous result in aspects other than and including constant amplitude maintenance. For instance, there are substantially no radio frequency interference problems in sine wave excitation, and amplification is more easily achieved because of a lower frequency pass band requirement. Furthermore, an AC output oscillator is regulated for constant amplitude more easily than square-wave oscillators.

AC output amplitude-stabilized oscillators presently in general use contain a variable impedance connected in the positive feedback path in order to attenuate the amplitude of the AC signal being fed back. The variable impedance is controlled by a DC control voltage derived from the AC output signal. Control of the amplitude of the oscillator AC output signal is thus attained by controlling the amplitude of the AC signal in the positive feedback path. Such oscillators, however, have proven sensitive to changes in input voltages, and highly sensitive to temperature variations. In addition, such oscillators have not exhibited great efficiency.

By reason of the advantageous aspects of sine wave oscillators heretofore alluded to, it is desirable to provide sine-wave excitation of transducers by means of an AC output oscillator inherently stable, high efficient and substantially insensitive to environmental, input voltage, and load changes.

SUMMARY OF THE INVENTION

The oscillator circuit of the present invention is substantially insensitive to any temperature variations within the range of −65°F to +225°F. Additionally, the circuit is substantially insensitive to voltage input changes within the range of 20 to 40 volts DC, and is insensitive to most variations in load. Furthermore, a high rate of efficiency is obtainable when using the oscillator circuit with transducer loads. As the load increases (i.e., draws more current), the efficiency approaches 100 percent.

In its broadest aspects, the invention deals with control of the amplitude of an AC output signal from an oscillator by controlling the DC current supplied to its input through a negative feedback path between its output and input. Such negative feedback path effectively contains an AC to DC converter for deriving a DC signal from the AC output signal. This DC signal is then supplied to a first input of a differential amplifier. A constant DC reference signal is supplied to a second input of the differential amplifier. The output of the differential amplifier consists of a DC current related to differential changes in the signals supplied at its inputs. Such DC current is supplied to the oscillator input for controlling the amplitude of the oscillator AC output. As the amplitude of the AC output signal from the oscillator tends to change, the DC current from the differential amplifier tends to inversely proportionally change thereby stabilizing such amplitude.

The great insensitivity of the circuit to temperature variations, input and load changes is provided by the use of the differential amplifier in the negative feedback path of the oscillator. Differential amplifiers are, by nature, insensitive to most environmental an other changes. Such amplifiers are sensitive only to differential changes in their input. As an example, differential amplifiers generally contain a pair of transistors connected such that, as temperature changes, the base-emitter junction voltage of each transistor increases a like amount, thereby nullifying the effect of such temperature variation at the differential amplifier output.

The high degree of efficiency obtainable when using the oscillator circuit with variable loads is provided by the control of the DC input current to the oscillator. When there is substantially no load on the oscillator, practically no current is needed and none is supplied to the oscillator input. As the load increases, the circuit automatically receives just enough more DC input current to fulfill the increased demand of the load. As the load increases, the efficiency of the circuit approaches 100 percent.

BRIEF DESCRIPTION OF THE DRAWINGS

These and other aspects of the invention will be more fully and completely described with reference to the drawing in which.

DESCRIPTION OF THE PREFERRED EMBODIMENT

Figure 1:
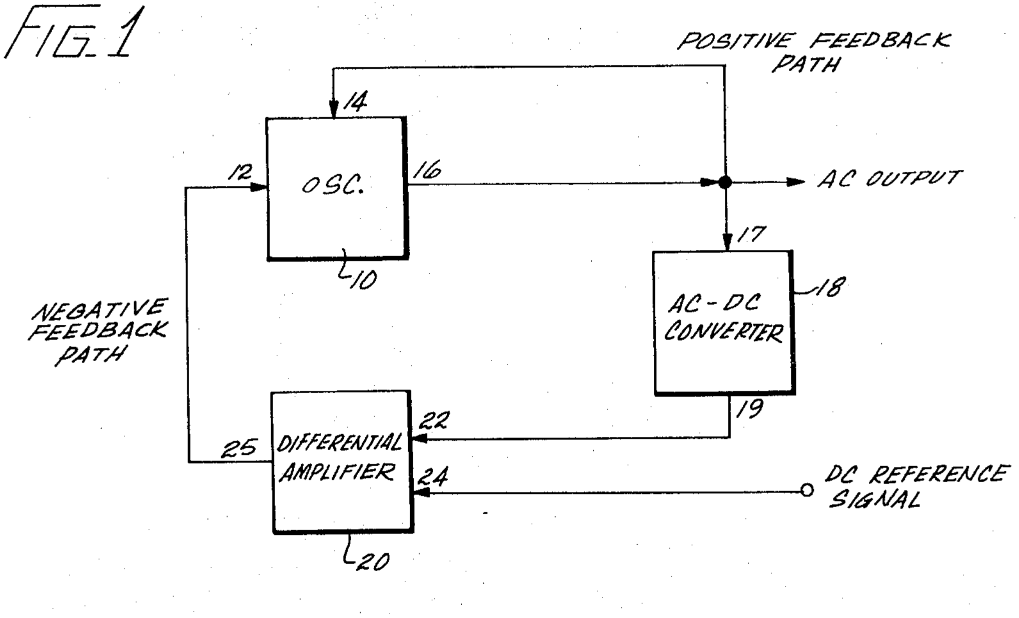
FIG. 1 is a block diagram of the oscillator circuit according to the present invention.
Figure 2:
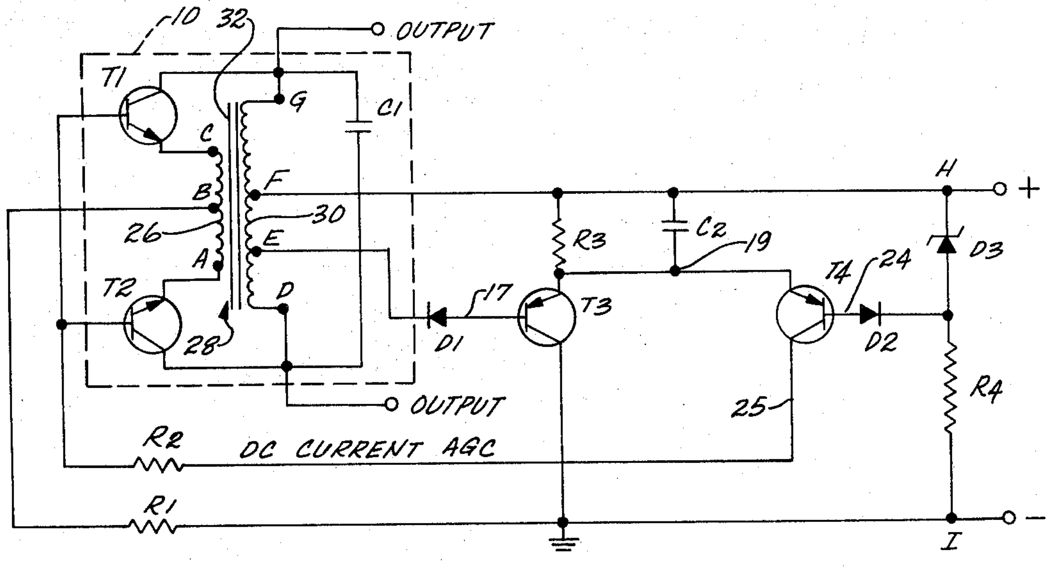
FIG. 2 is a detailed schematic diagram of the oscillator circuit according to the present invention.

The simplified block diagram representation of the preferred embodiment shown in FIG. 1, includes an oscillator 10 shown with two inputs 12 and 14 and one output 16. A positive feedback path is coupled between output 16 and input 14 and a negative feedback path is coupled between output 16 and input 12. An AC to DC converter 18 and a differential amplifier 20 are included within the negative feedback path. Output 16 of oscillator 10 is coupled to input 17 of converter 18 and output 19 of converter 18 is coupled to input 22 of differential amplifier 20, such that a DC signal derived from an AC signal output from the oscillator is effectively supplied to input 22 of differential amplifier 20. An input 24 of differential amplifier 20 is adapted to receive a constant-amplitude DC reference signal from a DC reference signal source (FIG. 2). The negative feedback path is formed since output 25 of the differential amplifier is coupled to input 12 of the oscillator. The AC output signal from oscillator 10 is maintained constant by controlling the amount of DC current supplied to input 12 from differential amplifier 20 (in a manner more fully and completely described with reference to FIG. 2 below).

Prior to a complete discussion of FIG. 2, it must be pointed out that the use of differential amplifier 20, or a substantial equivalent thereof, in the negative feedback path of oscillator 10 is essential for the purposes of the present invention. Differential amplifiers are, by nature, inherently stable notwithstanding changes in environmental conditions (such as temperature, etc.) and respond only to differential changes in its input. Differential amplifier 20, therefore, detects a change in the DC signal at input 22 and adjusts the current supplied to input 12 of oscillator 10 accordingly, i.e., if the AC output signal tends to increase so does the DC signal at input 22 thereby causing the current supplied to input 12 of oscillator 10 to be limited by differential amplifier 20.

The preferred embodiment will now be more fully and completely described in detail with reference to FIG. 2 of the drawing. Oscillator 10 of FIG. 1 includes a pair of transistor amplifiers T1 and T2 having their base electrodes interconnected and their emitter electrodes connected, respectively, to points C and A on winding 26 of transformer 28. It should be noted that two transistor amplifiers are used to achieve more efficient amplification with regard to each half-cycle of the sinusoidal output signal. In this regard, center tap B on winding 26 of transformer 28 is grounded through AC negative feedback resistor R1. It should be obvious, however, that a single transistor could be used instead of the dual transistors T1 and T2. The oscillator is energized by a DC voltage supplied at points H and I, point I being grounded.

Transformer 28 also includes winding 30 and core 32 disposed between windings 26 and 30. The frequency of oscillation of oscillator 10 is determined by a tuned circuit comprising the parallel combination of winding 30 and a capacitor C1. The collector electrodes of transistors T1 and T2 are connected respectively to points G and D on winding 30 of transformer 28. The oscillator output is taken across points G and D on winding 30 and positive feedback is accomplished by coupling the oscillator output back to transistor amplifiers T1 and T2 through the transformer 28 (coil 26 thereby acting as a feedback coil).

The negative feedback path of oscillator 10, as well as all other circuit elements shown in FIG. 2, will now be fully described. Differential amplifier 20 of FIG. 1 includes transistor amplifiers T3 and T4 having interconnected emitter electrodes. Transistors T3 and T4 are of the PNP type and operate substantially as emitter followers. In a manner more fully described below, it will be shown that the base electrode of transistor T3, together with the operative effect of resistor R3 and capacitor C2, represents input 22 of differential amplifier 20, as shown in FIG. 1, and the base electrode of transistor T4 represents input 24 of differential amplifier 20, also shown in FIG. 1. The collector electrode of transistor T3 is grounded so that the collector electrode of transistor T4 represents the single output of differential amplifier 20, such output being coupled through a current limiting resistor R2 to the base electrodes of transistors T1 and T2 (input 12 of FIG. 1).

The base electrode of transistor T3 is coupled to the output of oscillator 10 by means of a diode D1 connecting such base electrode to point E on winding 30 of transformer 28. Additionally, the base electrode of transistor T4 is coupled to a constant DC reference voltage source through a diode D2 connecting such base electrode to a Zener diode D3. A resistor R4 establishes the current flowing through Zener diode D3, such current remaining substantially constant thereby supplying a substantially constant DC reference voltage to the base electrode of transistor T4.

Either or both of diodes D1 and D2 may be eliminated if either or both transistors T3 and T4, respectively, are replaced by high emitter-base voltage type transistors. As an example, diode D1 prevents excessive emitter-base voltages from existing at transistor T3 when the AC signal at terminal E of coil 30 is positive-going. If the AC output from oscillator 10 is intended to be connected to a device having an inherent positive temperature coefficient, e.g., variable reluctance transducers, diode D2 can alone be omitted from the circuit, diode D1 remaining. The result of the sole presence of diode D1 gives the oscillator circuit the added advantage of having a negative temperature coefficient to balance the inherent positive temperature coefficient of the device connected to the oscillator output.

Thus, both of diodes D1 and D2 are used in the circuit unless transistors T3 and T4 are replaced by high emitter-base voltage type transistors. If a device with an inherent positive temperature coefficient is connected to the output of the oscillator, diode D2 alone can be eliminated thereby enabling diode D1 to such natural positive temperature coefficient. The elimination of one or both of diodes D1 and D2 for the stated purposes is well known in the art.

The parallel combination of a resistor R3 and a capacitor C2 have one common end connected to the interconnected emitter electrodes of transistors T3 and T4 and the other common end connected to a power supply voltage at center tap F on winding 30 of transformer 28. Resistor R3 and capacitor C2, in functional combination with transistor T3, detect and filter the AC output signal supplied to the base electrode of transistor T3 from point E on winding 30, such that a DC signal, proportional to the amplitude of the oscillator AC output signal, is in reality applied at input 22 of differential amplifier 20 (FIG. 1). The precise manner of rectification will be hereinafter explained in detail.

It must be noted that FIG. 1 has been broken down not only as to element, but also as to function. For instance, FIG. 1 shows input 22 to differential amplifier 20 as containing a DC signal. In FIG. 2, an AC signal is applied to the base electrode of transistor T3 whereas a DC signal derived therefrom appears across capacitor C2 (in a manner fully explained below). What can be stated, therefore, is that the true differential amplifier for the purposes intended contains the operative effect of AC-DC converter 18 (resistor R3 and capacitor C2) which, because of its long time constant, senses the peak value of the AC signal applied at its input thereby deriving a DC signal for comparative purposes by differential amplifier 20 (transistors T3 and T4).

In operation, and with reference to FIG. 2, the AC output signal is supplied to the base electrode of transistor T3 from point E on transformer winding 30. Transistor T3 is basically an emitter follower such that as its base electrode goes negative, so will its emitter electrode. Capacitor C2 charges through transistor T3 since the impedance of the latter is very low when conducting. The charge voltage of capacitor C2 is determined by the maximum negative AC voltage supplied at the base electrode of transistor T3. In the preferred embodiment, the emitter electrode of transistor T3 will always be about 0.6 volts more positive than its base electrode due to its emitter-base junction voltage.

The discharge path of capacitor C2 is through resistor R3. The discharge time is very long compared to the period of the AC output sine wave of the oscillator. The result is that a DC voltage is supplied at the interconnected emitter electrodes of transistors T3 and T4, such DC voltage being directly proportional to the peak value of the sine wave at the base electrode of transistor T3.

In the preferred embodiment, therefore, if the peak value of the AC output signal from the oscillator were 7 volts AC, the DC voltage across resistor R3 would be about 6.4 volts DC. If, then, the voltage across Zener diode D3 were 7.1 volts D.C., transistor T4 would be conducting heavily and the amplitude of the AC output from the oscillator would be increased since the current supplied at the interconnected base electrodes of transistors T1 and T2 would be increased.

In the above example, and with reference to FIG. 1, the DC voltage supplied at input 22 of differential amplifier 20 is 7.0 volts DC, whereas the DC reference voltage at input 24 is 7.1 volts DC. The resultant DC current supplied from the differential amplifier output to oscillator input 12 will cause the amplitude of the AC output signal to increase thereby increasing the DC voltage at input 22 of the differential amplifier A point will be reached, therefore, where the DC voltages at inputs 22 and 24 of differential amplifier 20 will be balanced thus maintaining constant the DC current supplied to oscillator 10 at input 12.

An important aspect of the present invention resides in the ability of differential amplifier 20 to inherently neutralize the effect of temperature and other environmental changes. As stated heretofore, differential amplifiers are, by nature, insensitive to most environmental and other changes, being sensitive only to differential changes in their input signals. In FIG. 2, for example, if temperature were to increase, the base-emitter junction voltage of transistor T3 would increase and the base-emitter junction voltage of transistor T4 would increase a like amount thereby nullifying the effect of such temperature variation at the collector electrode of transistor T4 (the differential amplifier output).

Another important aspect of the invention resides in the inherently high efficiency of the circuit when used with variable loads (such as variable reluctance transducers). By controlling the DC current supplied at the oscillator input, the oscillator is given only enough current to drive whatever load is being used. For instance, if relatively no load is present, very little DC current will be applied at the oscillator input, the load not requiring a higher output from the oscillator than that produced by such little current. As the load is increased, the DC input current is increased only an amount necessary for the oscillator to drive the load.

The circuit element values employed in the preferred embodiment of the invention are as follows:

R1 = 500 ohms
R2 = 10K ohms
R3 = 22K ohms
R4 = 22K ohms
C1 = 0.0047 mfd
C2 = 4.70 mfd
D3 = 6.1 volt Zener
H-I input voltage = 20–40 V.D.C.
D-G output voltage = 60 V.p. to p.

What has been described, therefore, is a unique amplitude stabilized and highly efficient oscillator circuit useful with, but not confined to use with, devices having negative temperature coefficients (such as variable reluctance transducers), such circuit employing a differential amplifier in a negative feedback path to control the amount of current supplied at an oscillator input.

What is claimed is:

1. An amplitude-stabilized sine-wave oscillator circuit comprising:

a sine-wave oscillator for producing a sinusoidal output signal the amplitude of which is controllable by a control current supplied to the sine-wave oscillator, which includes a transformer, and a pair of transistors with emitter-collector electrodes in push-pull connection to control current flow through a winding of the transformer, the transistors further having base electrodes which are connected to receive the supplied control current and operate at a substantially common potential;

converter means connected to the oscillator to receive a sinusoidal signal representative of the amplitude of the output signal, and to generate a DC signal representative of such signal;

a reference-signal source providing a constant-amplitude DC reference signal; and amplifying means connected to the converter means and reference-signal source for producing a control current representative of any difference in level between the two DC signals, the amplifying means being further connected to the bases of the pair of transistors to supply substantially all of the produced control current thereto.

2. The circuit defined in claim 1 wherein the transformer includes first and second windings each having three terminals including a center-tap terminal with the center-tap terminals serving as power input terminals and with the first winding being connected in series-circuit relationship between the emitter electrodes of the pair of transistors and with the second winding being connected in series-circuit relationship between the collector electrodes of the pair of transistors; and including a reactive element connected across the transformer for determining the frequency of the sinusoidal signal produced by the oscillator.

3. An amplitude-stabilized oscillator circuit for driving a transducer, comprising:

first and second power-input terminals;

an oscillator which includes a transformer with primary-winding input terminals, a primary center-tap terminal, secondary-winding output terminals, a secondary center-tap terminal coupled to the first power terminal, and means connecting the primary center-tap terminal to the second power terminal; a frequency-determining reactive element connected across the transformer; and a pair of alternately conducting transistors connected in push-pull relationship with the transformer primary winding, each transistor having emitter-collector electrodes connected between respective primary and secondary input and output terminals, the transistors having base electrodes which are connected together so as alternately to receive a control current for controlling amplitude of a sinusoidal oscillating output signal at the secondary output terminals;

a reference-signal source connected across the power-input terminals and providing a constant-amplitude DC reference signal;

and third and fourth transistors having interconnected emitter electrodes, the third transistor having a collector electrode connected to the second power terminal, and R-C network connected between the interconnected emitter electrodes and the secondary center-tap terminal, means connecting the transformer secondary to a base electrode of the third transistor, means connecting a base electrode of the fourth transistor to the reference-signal source to receive the reference signal, and means connecting a collector electrode of the fourth transistor to the interconnected base electrodes of the pair of transistors in the oscillator, the third and fourth transistors functioning as an amplifier to provide a control current substantially all of which flows through the fourth-transistor and collector electrode, and an alternate one of the pair of alternately conducting transistors, the control current being related in amplitude to any difference in amplitude between the reference signal and a DC signal representative of oscillator output-signal amplitude and derived through the interconnection of the R-C network, third transistor and transformer secondary.

4. An amplitude-stabilized sine-wave oscillator circuit comprising:

an amplitude-controllable sine-wave oscillator including a resonant circuit having first and second terminals; two transistors each having a collector electrode, a base electrode, and a base-emitter junction; the collector electrodes being coupled to respective terminals; the base electrodes being coupled together to operate at a substantially common potential; positive feedback means for causing the two transistors alternately to conduct current through their collector electrodes and to develop a substantially sinusoidal output voltage between the first and second terminals the amplitude of which is controllable by control current carried by the base-emitter junctions;

converter means connected to the oscillator to receive a sinusoidal signal representative of the amplitude of the output voltage, and to generate a DC signal representative of such signal;

a reference-signal source providing a constant-amplitude DC reference signal;

differential amplifier means having first and second inputs and an output, the first input being connected to the converter means, the second input being connected to the reference signal source, the differential amplifier means conducting through its output a variable-magnitude current that varies in accordance with any varying differences in voltage level between the two DC signals; and means for conducting substantially all of the variable-magnitude current to the base electrodes to serve as the control current carried by the base-emitter junctions.

5. The circuit as defined in claim 4 including a transformer having first and second windings, and a reactive element; the first winding being connected in series circuit relationship between the two terminals and in parallel circuit relationship with the reactive element to form the resonant circuit; the second winding being connected in series-circuit relationship between emitter electrodes of the two transistors to form the positive feedback means.

* * * * *